(12) United States Patent
Tu

(10) Patent No.: US 7,456,652 B2
(45) Date of Patent: Nov. 25, 2008

(54) APPARATUS FOR EXPRESSING CIRCUIT VERSION IDENTIFICATION INFORMATION

(75) Inventor: Chien-Cheng Tu, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 474 days.

(21) Appl. No.: 11/308,490

(22) Filed: Mar. 30, 2006

(65) Prior Publication Data

US 2007/0141865 A1 Jun. 21, 2007

(30) Foreign Application Priority Data

Dec. 19, 2005 (TW) .............................. 94145026 A

(51) Int. Cl.
*H03K 19/173* (2006.01)

(52) U.S. Cl. ............................................. 326/38; 326/8

(58) Field of Classification Search .................... 326/8, 326/9, 37, 38, 82
See application file for complete search history.

(56) References Cited

U.S. PATENT DOCUMENTS

| 2004/0036083 | A1* | 2/2004 | Kakeda ...................... 257/199 |
| 2005/0144582 | A1* | 6/2005 | Venkatraman et al. ......... 716/10 |
| 2008/0072193 | A1* | 3/2008 | Hsu .............................. 716/5 |

* cited by examiner

*Primary Examiner*—Don P Le
(74) *Attorney, Agent, or Firm*—Jianq Chyun IP Office

(57) ABSTRACT

An apparatus for expressing circuit version identification (VID) includes multiple conductive layers, a circuit VID unit, and a first and a second pull-up or pull-down circuits. Each of the conductive layers includes a first and a second conductive line. The first pull-up or pull-down circuit is coupled to the first conductive line. An input terminal of the circuit VID unit is coupled to the second conductive line. An output terminal of the circuit VID unit outputs the circuit VID. The second pull-up or pull-down circuit is coupled to the input terminal of the circuit VID unit. When the circuit VID needs to be in a first state, the first conductive line and the second conductive line are disconnected from each other. On the other hand, when the circuit VID needs to be in a second state, the first conductive line and the second conductive line are coupled to each other.

20 Claims, 3 Drawing Sheets

APPARATUS FOR EXPRESSING CIRCUIT VERSION IDENTIFICATION INFORMATION

CROSS-REFERENCE TO RELATED APPLICATION

This application claims the priority benefit of Taiwan application serial no. 94145026, filed on Dec. 19, 2005. All disclosure of the Taiwan application is incorporated herein by reference.

BACKGROUND OF THE INVENTION

1. Field of the Invention

The present invention relates to an integrated circuit. More particularly, the present invention relates to an apparatus for expressing circuit version identification information.

2. Description of the Related Art

With great leaps in technologies, data storage methods have advanced from the very early vacuum tubes and transistors to integrated circuit chips. An integrated circuit chip not only has a large storage capacity, but also occupies a small volume. It has been widely used in many different fields. Basically, most of the electronic products used in our daily life need to have a control switch; from a simple current-blocking device to a complicated microprocessor controlled system, each item has to be controlled by an integrated circuit chip.

At present, most application specific integrated circuits (ASIC) are required to work with a matching firmware. After a change in the ASIC version, the firmware needs to read out the circuit version identification information from the ASIC, the so-called version number. If the circuit version identification information does not match the firmware, it means that the firmware is unsuitable to run the ASIC having this particular version. As a result, the security mechanism will prevent the ASIC from incorrectly working.

FIG. 1 is a circuit diagram of a conventional circuit version identification apparatus. As shown in FIG. 1, the apparatus includes a pull-up circuit 101, a pull-down circuit 102 and a circuit version identification unit 103. In this example, the pull-up circuit is a P-type transistor 101 and the pull-down circuit is an N-type transistor 102. In addition, the circuit board identification unit 103 is an inverter 103. Moreover, the circuit version identification apparatus is a single bit device. Obviously, the integrated circuit may include a plurality of circuit version identification apparatuses. In other words, the circuit version identification information can be represented by a multiple of bits (the integrated circuit version number). However, only a single bit is shown in the present example.

Before having any changes to the version of the integrated circuit, the circuit version identification apparatus is assumed to output a logic low potential. That is, the input terminal of the inverter 103 is coupled with the drain of the P-type transistor 101, the source of the P-type transistor 101 receives a power source potential VDD, the gate of the P-type transistor 101 is connected to a ground GND, and the input terminal of the inverter 103 and the N-type transistor 102 are in a cut-off state. On the other hand, when the integrated circuit has a changed version and assumes the circuit version identification apparatus needs to output a logic high potential, the input terminal of the inverter 103 will be cut off from the P-type transistor 101. Furthermore, the drain of the N-type transistor 102 is coupled with the input terminal of the inverter 103, the source of the N-type transistor 102 is connected to the ground GND, and the gate of the N-type transistor 102 receives the power source potential VDD.

However, changing the logic state output from the circuit version identification apparatus, for example, from a logic high potential to a logic low potential or from a logic low potential to a logic high potential, requires a change of the photomask. Assume that only the third layer photomask of the original integrated circuit is changed due to some particular function; however, in order to modify the circuit version identification (the version number), a modification of other photomask (for example, the first layer photomask) is required so that the production cost is unavoidably increased.

SUMMARY OF THE INVENTION

Accordingly, at least one objective of the present invention is to provide an apparatus for expressing circuit version identification, capable of eliminating unnecessary photomask and reducing production cost.

To achieve these and other advantages and in accordance with the purpose of the invention, as embodied and broadly described herein, the invention provides an apparatus for expressing circuit version identification. The apparatus includes a plurality of conductive layers, a circuit version identification unit, and a first and a second pull-up or pull-down circuit. Each conductive layer includes a first conductive line and a second conductive line. The first pull-up or pull-down circuit is electrically connected to the first conductive line of the conductive lines. An input terminal of the circuit version identification unit is electrically connected to the second conductive line of the conductive layers. An output terminal of the circuit version identification unit outputs the circuit version identification information. The second pull-up or pull-down circuit is electrically connected to the input terminal of the circuit version identification unit. When the circuit version identification information needs to be in a first state, the first conductive line and the second conductive line are disconnected from each other. On the other hand, when the circuit version identification information needs to be in a second state, the first conductive line and the second conductive line are electrically connected to each other.

According to the circuit version identification apparatus in one preferred embodiment of the present invention, each conductive layer has a third conductive line. The second pull-up or pull-down circuit is electrically connected to the third conductive line of each conductive layer through a contact. The third conductive line in the uppermost conductive layer of the conductive layers is electrically connected to the second conductive line for electrically connecting with the input terminal of the circuit version identification unit. When the circuit version identification information needs to be in the second state, the third conductive line disposed in the conductive layer connecting the first conductive line and the second conductive line is canceled.

In the present invention, the apparatus for expressing circuit version identification has a conductive line set up in each conductive layer and a reserved connecting portion between the conductive line of each conductive layer. When the integrated circuit needs to change circuit version identification information due to a functional modification of a particular layer of photomask, the modification can be carried out directly on the layer of photomask. The layer of photomask can be used to connect with the reserved connecting portion so that a modification of the circuit version identification information can be achieved. There is no need to modify other photomask layer in order to change the circuit version identification information.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
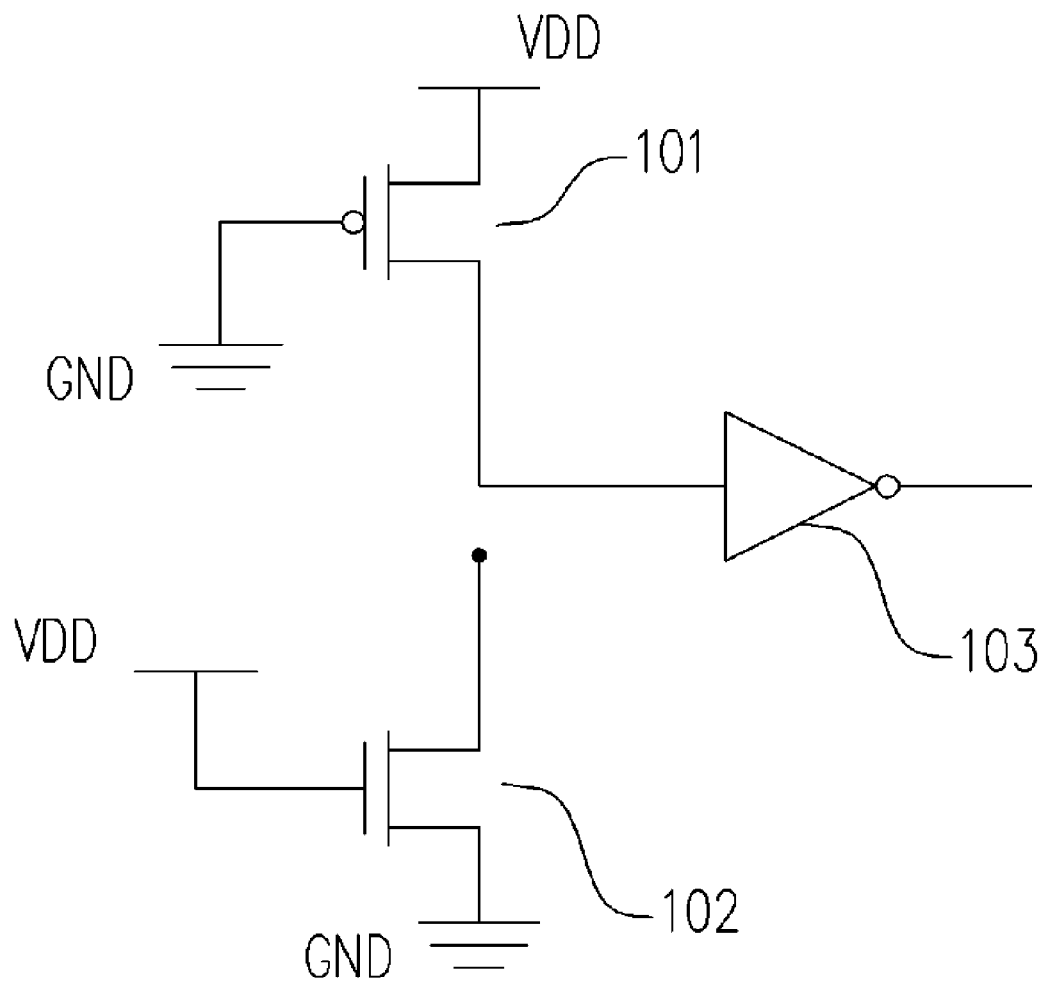
FIG. 1 is a circuit diagram of a conventional circuit version identification apparatus.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
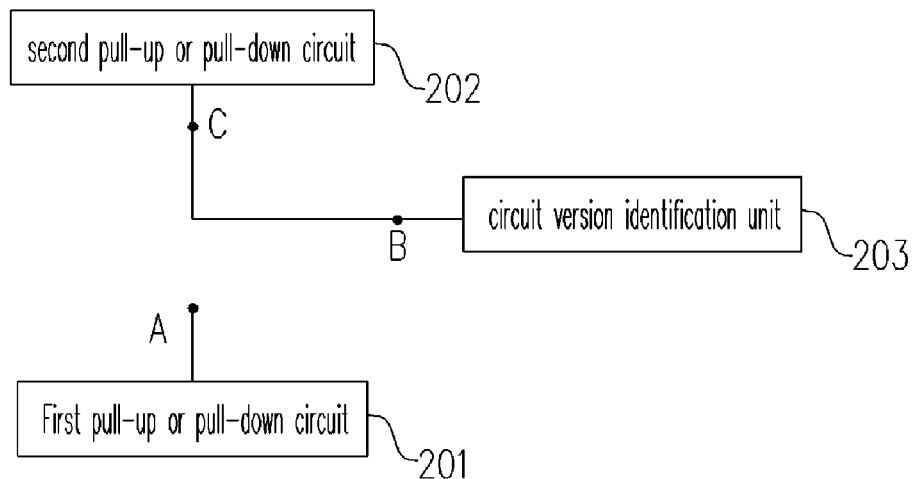
FIG. 2A is a circuit diagram of a circuit version identification apparatus according to one embodiment of the present invention.

FIG. 2A is a circuit diagram of a circuit version identification apparatus according to one embodiment of the present invention. As shown in FIG. 2A, the circuit includes a first pull-up or pull-down circuit 201, a second pull-up or pull-down circuit 202 and a circuit version identification unit 203. Three nodes are also labeled in the circuit diagram, namely, a first node A, a second node B and a third node C. The first node A is located at one terminal of the first pull-up or pull-down circuit 201. The second node B is located at the input terminal of the circuit version identification unit 203. The third node C is located at one terminal of the second pull-up or pull-down circuit 202.

The first pull-up or pull-down circuit 201 provides a first potential. In the present embodiment, the first potential is a ground potential GND. The second pull-up or pull-down circuit 202 provides a second potential. In the present embodiment, the second potential is a power source potential VDD. In the present embodiment, the first pull-up or pull-down circuit 201 is a pull-down circuit (hereinafter "a pull-down circuit") and the second pull-up or pull-down circuit 202 is a pull-up circuit (hereinafter "a pull-up circuit"). Anyone familiar with the technique may notice that if the first pull-up or pull-down circuit 201 provides a power source potential VDD, it is a pull-up circuit. Similarly, if the second pull-up or pull-down circuit 202 provides a ground potential GND, it is a pull-down circuit 202.

Figure 2B:
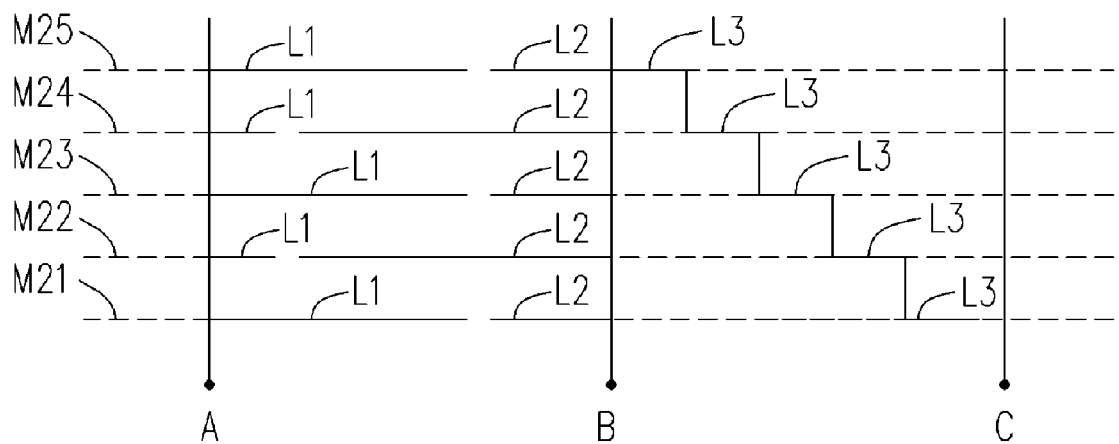
FIG. 2B is a circuit diagram of a circuit version identification apparatus showing the disposition of a first node point A, a second node point B and a third node point C on a semiconductor substrate according to one embodiment of the present invention.

FIG. 2B is a circuit diagram of a circuit version identification apparatus showing the disposition of a first node point A, a second node point B and a third node point C on a semiconductor substrate according to one embodiment of the present invention. In the present embodiment, five conductive layers M21, M22, M23, M24 and M25 are disposed on the semiconductor substrate. Each conductive layer has a first conductive line L1, a second conductive line L2 and a third conductive line L3. A dielectric layer separates two adjacent conductive layers. In the present embodiment, the first conductive line L1 in each conductive layer and the second conductive line L2 in the adjacent conductive layer are partially overlapped. Furthermore, there is a gap between the first conductive line L1 and the second conductive line L2 in the same conductive layer. Moreover, the third conductive line L3 in the fifth conductive layer M25 is electrically connected to the second conductive line L2 of the fifth conductive layer M25. The first conductive line L1, the second conductive line L2 and the third conductive line L3 in each layer are serially connected through contact plug/via plug.

First, assume that the circuit version identification apparatus in the present embodiment is installed inside an integrated circuit for indicating the version number of the integrated circuit. Then, assume that the circuit version identification unit 203 is implemented through an inverter. Because the second node B and the third node C are electrically connected and the second pull-up or pull-down circuit 202 provides a second potential (the second potential is the power source potential VDD), the circuit version identification unit 203 outputs a logic low potential. In addition, assume that the photomask of the third conductive layer M23 in the integrated circuit has been changed to provide a particular function. Hence, the circuit version identification information from the circuit version identification apparatus needs to change from a logic low potential to a logic high potential.

Figure 2C:
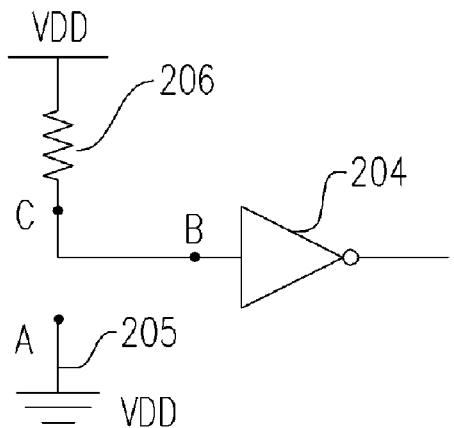
FIG. 2C is an actual application circuit for the circuit shown in FIG. 2A.

According to the foregoing assumptions, the actual implementation of the embodiment in FIG. 2A of the present invention is shown in FIG. 2C. As shown in FIG. 2C, the circuit includes an inverter 204, a pull-down circuit 205 and a pull-up circuit 206. The pull-down circuit 205 is electrically connected to a ground potential GND and implemented through a conductive pathway (conductive line). The pull-up circuit 206 is implemented by electrically connecting one terminal of an impedance device (a resistor) to the power source potential VDD and electrically connecting another terminal to the input terminal of the inverter 204. Then, as shown in FIG. 2B, when the circuit version identification information needs to be in a high logic potential, the first node A and the second node B must be electrically connected. Therefore, with the setup on the semiconductor substrate as shown in FIG. 2B, the electrical connection between the first node A and the second node B can be achieved merely by electrically connecting the first conductive line L1 and the second conductive line L2 of the third conductive layer M23. Hence, there is no need to change any of the other photomasks.

Through the foregoing embodiment, the circuit version identification information is set to a logic high potential state. However, if only the first node A and the second node B are electrically connected, the pull-up circuit will have a direct current flowing, which will lead to power wastage. Similarly, according to the actual implementation in FIG. 2B, only the disposition of the third conductive line L3 in the third conductive layer M23 is required to be cancelled in order to cut off the connection between the first node A and the second node B without modifying any other photomasks.

Figure 2D:
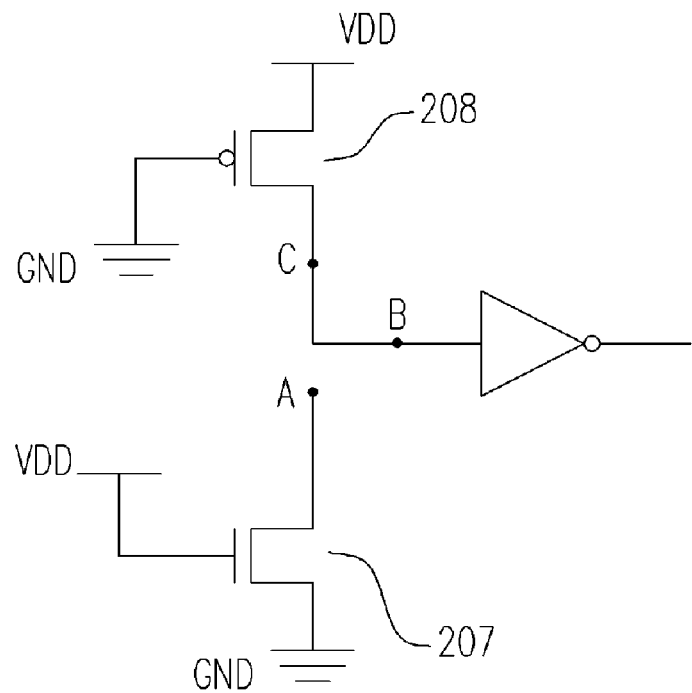
FIG. 2D is another actual application circuit for the circuit shown in FIG. 2A.

FIG. 2D is another actual application circuit for the circuit shown in FIG. 2A. In the circuit, the first pull-up or pull-down circuit 201 in FIG. 2A is implemented using an N-type transistor 207. The gate of the N-type transistor 207 is electrically connected to a conducting potential to render the N-type transistor 207 conductive. In the present embodiment, the conducting potential is the power source potential VDD. The first source/drain receives the ground potential GND and the second source/drain electrically connect with the first conductive line L1. The second pull-up or pull-down circuit 202 in FIG. 2A is implemented using a P-type transistor 208. The gate of the P-type transistor 208 is electrically connected to another conducting potential to render the P-type transistor 208 conductive. In the present embodiment, the conductive potential is the ground potential. The first source/drain receives the power source potential VDD and the second source/drain electrically connect with the third conductive line L3. Anyone familiar with the technology may also notice that the foregoing embodiment can also be implemented in the apparatus to achieve a modification of the circuit version identification information without changing the other layers of the photomasks. Therefore, a detailed elaboration is omitted here.

Figure 3:
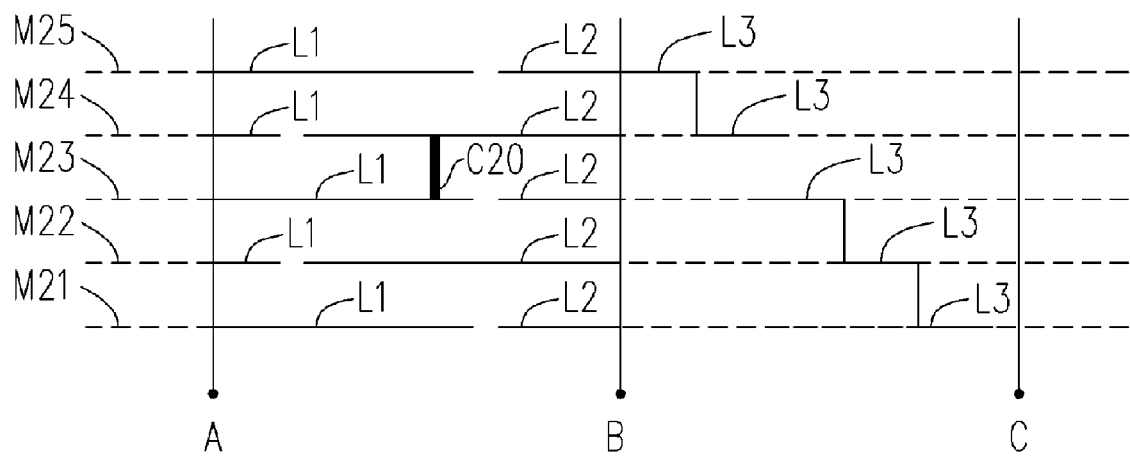
FIG. 3 is a circuit diagram of a circuit version identification apparatus showing the disposition of a first node A, a second node B and a third node C on a semiconductor substrate according to one embodiment of the present invention.

Similarly, assume that the photomask between the third conductive layer M23 and the fourth conductive layer M24 in the integrated circuit has been changed (changing the contact/via plug for providing a particular function) to provide a particular function. Hence, the circuit version identification information from the circuit version identification apparatus needs to change from a logic low potential to a logic high potential. By electrically connecting the second conductive line L2 of the fourth conductive layer M24 and the first conductive line L1 of the third conductive layer M23 through the contact C20 and canceling the disposition of the contact between the third conductive line L3 of the fourth conductive layer M24 and the third conductive line L3 of the third conductive layer M23 as shown in FIG. 3, the circuit version identification information can be changed without modifying the other layers of the photomasks.

In summary, the apparatus for expressing circuit version identification in the present invention has a conductive line set up in each conductive layer and a reserved connecting portion between the conductive lines of each conductive layer. Thus, when the integrated circuit needs to change circuit version identification information due to a functional modification of a particular layer of photomask, the modification can be carried out directly on the layer of photomask. The layer of photomask can be used to connect with the reserved connecting portion so that a modification of the circuit version identification information can be achieved. In other words, there is no need to modify other photomask layer in order to change the circuit version identification information.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit version identification apparatus, comprising:
   a plurality of conductive layers, wherein each of the conductive layers has a first conductive line and a second conductive line;
   a first pull up/down circuit electrically connected to the first conductive line of the conductive layers for providing a first potential;
   a circuit version identification unit having an input terminal and an output terminal, wherein the input terminal of the circuit version identification unit is electrically connected to the second conductive line of the conductive layers, and the output terminal of the circuit version identification unit is used for outputting a circuit version identification information; and
   a second pull up/down circuit electrically connected to the input terminal of the circuit version identification unit for providing a second potential;
   wherein, the first conductive line and the second conductive line are disconnected when the circuit version identification information needs to be in a first state; and the first conductive line and the second conductive line in one of the conductive layers are electrically connected when the circuit version identification information needs to be in a second state.

2. The circuit version identification apparatus of claim 1, wherein each conductive layer further includes a third conductive line such that the second pull up/down circuit is electrically connected to the third conductive line of each conductive layer through a contact, and the third conductive line is electrically connected to the second conductive line for electrically connecting with the input terminal of the circuit version identification unit; wherein the disposition of the third conductive line in the conductive layers is canceled when the circuit version identification information needs to be in a second state.

3. The circuit version identification apparatus of claim 1, wherein the first pull up/down circuit further includes:
   a first impedance device having a terminal receiving a first potential and another terminal electrically connecting to the first conductive line of the conductive layers.

4. The circuit version identification apparatus of claim 3, wherein the first impedance device includes a first type transistor having a gate electrically connected to a conducting potential, a first source/drain for receiving a first potential and a second source/drain for electrically connecting with the first conductive line of the conductive layers.

5. The circuit version identification apparatus of claim 4, wherein the first type transistor includes an N-type transistor, the first potential includes a ground potential and the conducting potential includes a second potential.

6. The circuit version identification apparatus of claim 1, wherein the second pull up/down circuit further includes:
   a second impedance device having a terminal receiving a second potential and another terminal electrically connecting to the input terminal of the circuit version identification unit.

7. The circuit version identification apparatus of claim 6, wherein the second impedance device includes a second type transistor having a gate electrically connected to a conducting potential, a first source/drain for receiving the second potential, and a second source/drain for connecting with the input terminal of the circuit version identification unit.

8. The circuit version identification apparatus of claim 7, wherein the second type transistor includes a P-type transistor, the second potential includes a power source potential and the conducting potential includes a first potential.

9. The circuit version identification apparatus of claim 1, wherein the circuit version identification unit includes an inverter.

10. The circuit version identification apparatus of claim 1, wherein a dielectric layer is disposed between each of the conductive layers.

11. A circuit version identification apparatus, comprising:
    a plurality of conductive layers, wherein each conductive layer has a first conductive line and a second conductive line;

a first pull up/down circuit electrically connected to the first conductive line of the conductive layers for providing a first potential;

a circuit version identification unit having an input terminal and an output terminal, wherein the input terminal of the circuit version identification unit is electrically connected to the second conductive line of the conductive layers, and the output terminal of the circuit version identification unit is used for outputting circuit version identification information; and a second pull up/down circuit electrically connected to the input terminal of the circuit version identification unit for providing a second potential;

wherein, the first conductive line and the second conductive line are disconnected when the circuit version identification information needs to be in a first state; and the first conductive line in one of the conductive layers and the second conductive line of an adjacent conductive layer are electrically connected through a contact when the circuit version identification information needs to be in a second state.

12. The circuit version identification apparatus of claim 11, wherein each conductive layer further includes a third conductive line such that the second pull up/down circuit is electrically connected to the third conductive line of each conductive layer through a contact, and the third conductive line is electrically connected to the second conductive line for electrically connecting with the input terminal of the circuit version identification unit; wherein the disposition of the contact of the third conductive line of the adjacent conductive layer is canceled when the circuit version identification information needs to be in a second state.

13. The circuit version identification apparatus of claim 11, wherein the first pull up/down further includes:

a first impedance device having a terminal receiving a first potential and another terminal electrically connecting to the first conductive line of the conductive layers.

14. The circuit version identification apparatus of claim 13, wherein the first impedance device includes a first type transistor having a gate electrically connected to a conducting potential, a first source/drain for receiving a first potential and a second source/drain for electrically connecting with the first conductive line of the conductive layers.

15. The circuit version identification apparatus of claim 14, wherein the first type transistor includes an N-type transistor, the first potential includes a ground potential and the conducting potential includes a second potential.

16. The circuit version identification apparatus of claim 11, wherein the second pull up/down circuit further includes:

a second impedance device having a terminal receiving a second potential and another terminal electrically connecting to the input terminal of the circuit version identification unit.

17. The circuit version identification apparatus of claim 16, wherein the second impedance device includes a second type transistor having a gate electrically connected to a conducting potential, a first source/drain for receiving the second potential, and a second source/drain for connecting with the input terminal of the circuit version identification unit.

18. The circuit version identification apparatus of claim 17, wherein the second type transistor includes a P-type transistor, the second potential includes a power source potential and the conducting potential includes a first potential.

19. The circuit version identification apparatus of claim 11, wherein the circuit version identification unit includes an inverter.

20. The circuit version identification apparatus of claim 11, wherein a dielectric layer is disposed between each of the conductive layers.

* * * * *